(12) United States Patent
Kurapov et al.

(10) Patent No.: US 9,957,600 B2
(45) Date of Patent: May 1, 2018

(54) TARGET AGE COMPENSATION METHOD FOR PERFORMING STABLE REACTIVE SPUTTERING PROCESSES

(71) Applicant: Oerlikon Surface Solutions AG, Trübbach (CH)

(72) Inventors: Denis Kurapov, Walenstadt (CH); Siegfried Krassnitzer, Feldkirch (AT)

(73) Assignee: Oerlikon Surface Solutions AG, Präffikon, Präffikon (CH)

( * ) Notice: Subject to any disclaimer, the term of this patent is extended or adjusted under 35 U.S.C. 154(b) by 292 days.

(21) Appl. No.: 14/902,575

(22) PCT Filed: Jun. 30, 2014

(86) PCT No.: PCT/EP2014/001780
§ 371 (c)(1),
(2) Date: Jan. 3, 2016

(87) PCT Pub. No.: WO2015/000575
PCT Pub. Date: Jan. 8, 2015

(65) Prior Publication Data
US 2016/0168686 A1   Jun. 16, 2016

(30) Foreign Application Priority Data
Jul. 3, 2013   (DE) .................. 10 2013 011 068

(51) Int. Cl.
| | |
|---|---|
| C23C 14/00 | (2006.01) |
| C23C 14/06 | (2006.01) |
| C23C 14/34 | (2006.01) |
| C23C 14/54 | (2006.01) |
| H01J 37/32 | (2006.01) |

(Continued)

(52) U.S. Cl.
CPC ...... *C23C 14/0042* (2013.01); *C23C 14/0641* (2013.01); *C23C 14/14* (2013.01); *C23C 14/3485* (2013.01); *C23C 14/3492* (2013.01); *C23C 14/35* (2013.01); *C23C 14/54* (2013.01); *H01J 37/32449* (2013.01); *H01J 37/32935* (2013.01); *H01J 37/3405* (2013.01); *H01J 37/347* (2013.01); *H01J 37/3426* (2013.01); *H01J 37/3467* (2013.01); *H01J 37/3476* (2013.01); *H01J 2237/006* (2013.01); *H01J 2237/24585* (2013.01); *H01J 2237/3323* (2013.01)

(58) Field of Classification Search
CPC .................................................. C23C 14/3492
USPC ........................................ 204/192.13, 192.33
See application file for complete search history.

(56) References Cited

U.S. PATENT DOCUMENTS

| | | | |
|---|---|---|---|
| 5,783,048 A | 7/1998 | Hurwitt | |
| 6,562,715 B1 * | 5/2003 | Chen .................. | C23C 16/34 204/192.17 |

(Continued)

FOREIGN PATENT DOCUMENTS

| | | |
|---|---|---|
| DE | 19605316 C1 | 12/1996 |
| DE | 10347521 | 6/2004 |

(Continued)

*Primary Examiner* — Timon Wanga (57) ABSTRACT

A method for performing reactive sputtering processes while maintaining the sputtering characteristic at the target as well as the deposition rate constant, or at least in an acceptable range for the industrial production context, independent of the target age.

17 Claims, 4 Drawing Sheets

(51) Int. Cl.
*H01J 37/34* (2006.01)
*C23C 14/14* (2006.01)
*C23C 14/35* (2006.01)

(56) References Cited

U.S. PATENT DOCUMENTS

| | | | | |
|---|---|---|---|---|
| 7,324,865 | B1* | 1/2008 | Sonderman | C23C 14/34 |
| | | | | 438/5 |
| 8,276,648 | B2* | 10/2012 | Hsiao | C23C 14/3407 |
| | | | | 164/464 |
| 2005/0161322 | A1 | 7/2005 | Smathers | |
| 2006/0151312 | A1 | 7/2006 | Scherer et al. | |
| 2012/0132518 | A1* | 5/2012 | Miller | H01J 37/3408 |
| | | | | 204/192.13 |

FOREIGN PATENT DOCUMENTS

| | | |
|---|---|---|
| JP | H02179869 A | 7/1990 |
| JP | 2005330571 A | 12/2005 |
| WO | 0005745 A1 | 2/2000 |
| WO | 0116394 A1 | 3/2001 |
| WO | 2013045493 A1 | 4/2013 |

* cited by examiner

TARGET AGE COMPENSATION METHOD FOR PERFORMING STABLE REACTIVE SPUTTERING PROCESSES

FIELD OF THE INVENTION

The present invention relates to a method for performing reactive sputtering processes maintaining the sputtering characteristic, at the target as well as the deposition rate constant, or at least in the industrial production context an acceptable range, independent of the target age.

BACKGROUND OF THE INVENTION

The sputtering technique is a well-established physical vapor deposition (PVD) method, which is used for depositing thin films for a broad variety of applications. In particular, wear protective coatings for cutting tools applications can be successfully deposited by using the sputtering technology. Especially, the coating quality can be improved significantly by using high-power impulse magnetron sputtering (HIPIMS) methods.

A fundamental part of a sputtering apparatus is the at least one sputtering target used as material source for providing, the necessary deposition species for the coating growth on the substrate surface placed in the coating chamber. In the case of reactive sputtering processes the species obtained from the target react with the reactive gas present in the coating chamber for forming the film on the substrate surface to be coated. Target material from the target surface is sputtered b collision of ions (essentially ions from an ionized non-reactive gas), which are attracted to the target surface through the application of a magnetic field. Thus, the sputtering process at the target leads to erosion of the target surface and consequently to a change of the target weight.

Particularly, strong erosion of the target surface can be observed on the areas of the target subjected to a strong magnetic field, which leads to undesirable changes in the coating plasma conditions and consequently in the coating growth on the substrate surface.

Different methods for avoiding these undesirable changes are proposed currently by the state of the art.

For example, the patent document WO0116394A1 proposes a method for controlling reactive sputter deposition of a compound formed from reaction between a reactive species that results from excitation of a reactive gas and a material included in a target acting as a cathode. The method comprising the steps of: establishing reactive sputter deposition at a nominal flow rate or partial pressure of the reactive gas; and stabilizing the cathode voltage at a nominal voltage by adjusting the power supplied to the cathode, wherein said normal voltage and nominal flow rate or partial pressure are determined according to an equilibrium state or steady state condition among said cathode voltage, said nominal flow rate or partial pressure of the reactive gas, and power supplied to the cathode.

Similarly, the patent documents U.S. Pat. No. 5,783,048 A, WO0005745 and WO2013045493A1 propose different sputtering apparatus and methods for controlling sputter deposition by adjusting the magnetic field in order to compensate for the undesirable changes caused by target erosion during sputtering of the target surface.

U.S. Pat. No. 5,783,048A discloses a sputtering apparatus for forming a thin film on a substrate, the formed film exhibiting a substantially uniform thickness. The apparatus including a target for providing target material for forming the thin film, wherein the target includes a first area. The sputtering apparatus further includes a plasma discharge to enable removal of target material from the target. In addition, a main magnet is provided for generating a main magnetic field for controlling the plasma discharge to remove the target material. Further, a compensating magnet is utilized which is positioned adjacent to the first area. The compensating magnet generates a compensating magnetic field which interacts with the main magnetic field to control the plasma discharge in the first area to form a desired erosion pattern in the first area and enable formation of a substantially uniform film thickness on the substrate.

WO0005745A1 discloses an apparatus and a method for compensating for process-related asymmetries produced in physical vapor processing of a surface, in particular, when sputtering material from a source is deposited onto a substrate for forming a film. A compensating magnet is configured and positioned to produce a compensating magnetic field to offset the effects of chamber and process-related asymmetries, particularly those that affect the distribution of plasma processing on a substrate where the plasma has been otherwise symmetrically produced.

WO2013045493A1 proposes a method for magnetron sputtering in a sputtering apparatus, which has a cathode, a target, which is arranged on a surface of the cathode or is part of said surface of the cathode, and a magnet set arranged on a side of the cathode facing away from said surface, wherein the target is eroded at least in some areas on an eroding surface during the sputtering, and wherein a distance between the magnet set and the eroding surface of the target is adjusted during the course of the eroding in such a way that an impedance of a circuit comprising the cathode changes only by less than a predetermined value due to the eroding during the course of the eroding, which predetermined value is less than an impedance difference between the impedance for the non-eroded target and the impedance for the maximally eroded target at an unadjusted distance.

However, coating different kind of substrates for different applications in the industrial production context involves additional difficulties which are not easy to overcome by using the current technologies provided by the state of the art.

For attaining the necessary reproducibility, operating efficiency and for ensuring product quality in the industrial production context it is essential to operate all coating batches at stable conditions (especially same conditions as possible), but in this context the targets must be operated for a very long time for performing several batches. It leads not only to coating conditions instabilities caused by the art and/or form of the erosion at the target surface, but also caused by a considerable reduction of the target mass resulting from the prolonged erosion of the target after several batches, which in the context of the present invention will be called target age. The target age leads in turn to undesirable changes in the sputtering characteristic of the target and in the film deposition rate, particularly by accomplishing reactive sputtering processes, as it is shown in the FIGS. 1 and 2. For most of the coating applications, and particularly in the industrial production context are these changes unacceptable.

Figure 1:
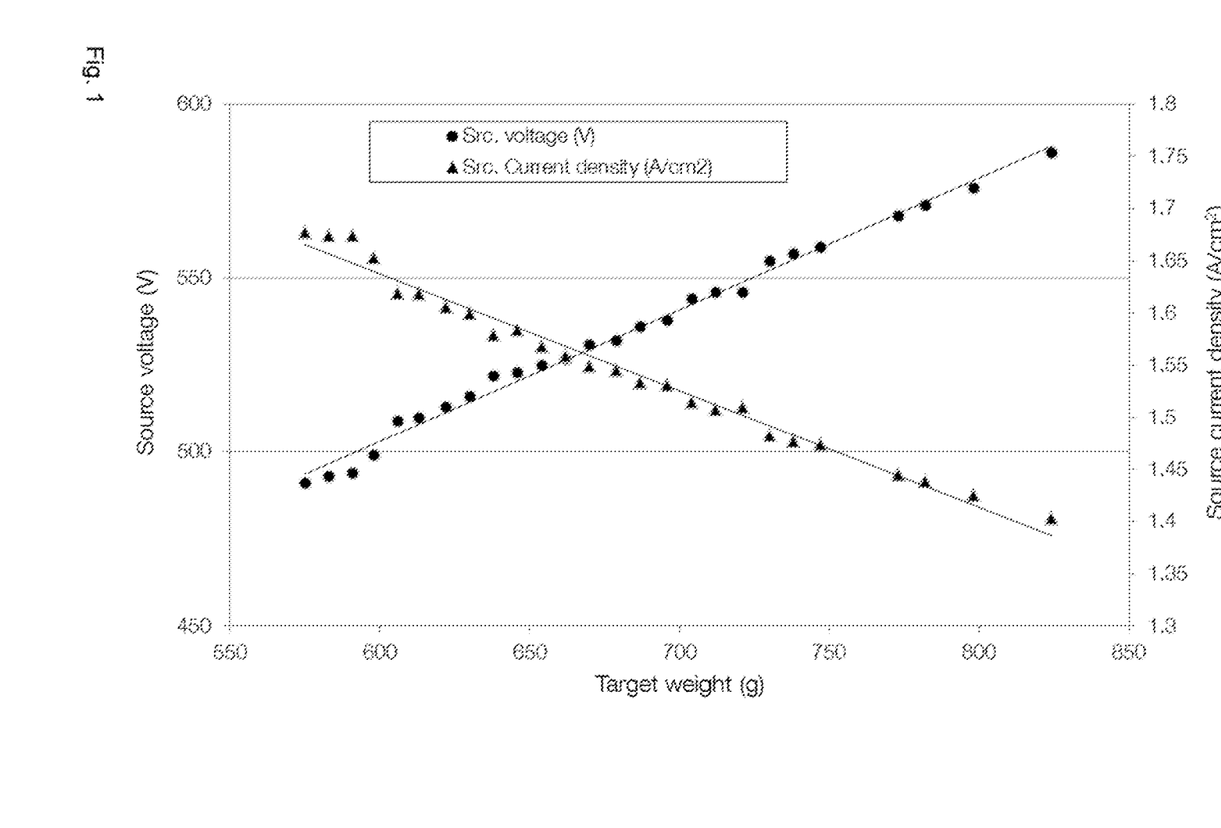
FIG. 1 shows the variation of the source (target) voltage in volts and current density in amperes per square centimeter in relation to the target weight in grams obtained by reactive sputtering.

FIG. 1 shows the variation of the source (target) voltage in volts and current density in amperes per square centimeter in relation to the target weight in grams obtained by reactive sputtering, of one aluminum chromium target in an argon-nitrogen atmosphere by applying a constant power density at a target of about 1 kW/cm$^2$ and maintaining nitrogen partial pressure constant at a value of 0.27 Pa. Also the substrate temperature was maintained constant during sputtering for all attempts. A magnetic field was generated by using permanent magnets arranged behind the target in order to increase the probability of detention of electrons in the area in front of the target. The used target was a disk-shaped target having constant diameter Ø150 mm and variable thickness which was reducing during sputtering causing thus reduction of the target weight. The element composition of the used target was 60 at.-% Al and 40 at.-% Cr.

Figure 2:
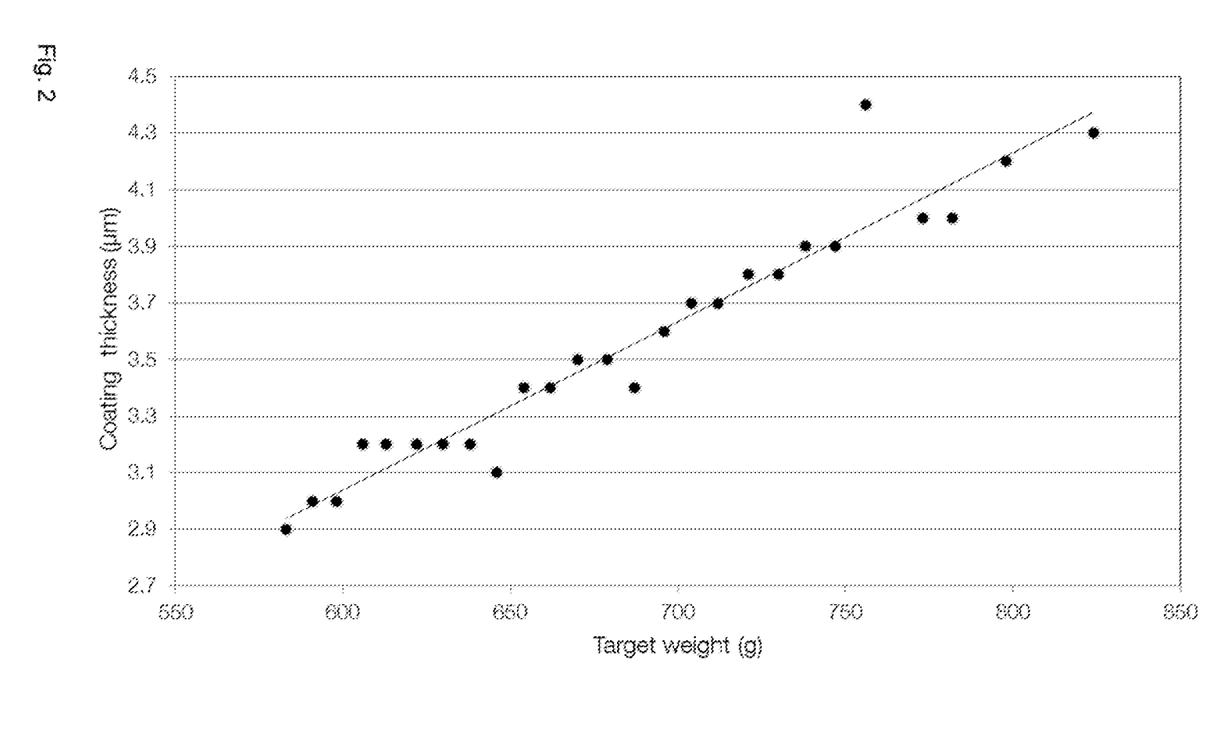
FIG. 2 shows the measured coating thickness in µm of the films deposited on the surface of flat samples in relation to the weight in grams of the target used for the film deposition.

FIG. 2 shows the measured coating thickness in µm of the films deposited on the surface of flat samples in relation to the weight in grams of the target used for the film deposition. Each film was deposited by reactive sputtering of one AlCr-target in an argon-nitrogen atmosphere. The films were deposited by using the same coating configuration and under same coating conditions as those used for accomplishing the experiments displayed in FIG. 1. In order to be able to analyze the relation between deposition rate and target weight, each film was deposited on the corresponding samples during 117 minutes under same coating conditions regarding power density at the target, reactive partial pressure, substrate temperature. Only the target weight was different by accomplishing the deposition of each film.

SUMMARY OF THE INVENTION

It is an objective of the present invention to provide a simple method for coating different kind of substrates for different applications in an industrial production context, which overcome the difficulties caused by the loss of mass of the targets produced during reactive sputtering. In particular, it is an objective of the present invention to provide an uncomplicated method for performing reactive spattering processes maintaining the sputtering characteristic at the target as well as the deposition rate constant, or at least in an acceptable range for the industrial production context, independent of the target age. Furthermore, it is an objective of the present invention to provide, a sputtering apparatus for coating, substrates in the industrial production context by using reactive sputtering techniques and applying the method according to the present invention.

DETAILED DESCRIPTION OF THE PREFERRED EMBODIMENTS

The aforementioned objective is achieved by the present invention by providing a method for adjusting the partial pressure of the reactive gas depending on the target age in order to obtain constant sputtering characteristic at the target as well as constant deposition rate by reactive sputtering coating processes.

Surprisingly, the inventors found that it is possible to maintain the sputtering characteristic at target as well as the deposition rate almost constant or more exactly in an acceptable range of variation, if the reactive gas partial pressure is adjusted depending on the target weight and at the same time the sputtering power density at the target is maintained constant during the reactive sputtering coating process.

In the context of the present invention an acceptable range of variation for the industrial production context is:
 particularly about +/−10% or less for the sputtering characteristic (in particular regarding target voltage and target current density),
 particularly about +/−15% or less for the deposition rate,
in relation to a corresponding target value defined for each parameter (namely target voltage, target current density and deposition rate). These target values are preferably defined at coating conditions attained by using targets in as-manufactured condition for performing the coating process.

In the context of the present invention the as-manufactured condition will be also called in new condition. Of course, an in-new-condition target should exhibit the highest target weight because n has still not been used for performing coating processes or at least not for a long time.

Preferably, an acceptable range of variation in the context of the present invention is for the sputtering characteristic, about +/−7% or less, and for the deposition rate is about +/−10% or less. Even more preferably, an acceptable range of variation in the context of the present invention is for the sputtering characteristic, about +/−5% or less, and for the deposition rate is about +/−7% or less.

Particularly very good results were obtained by applying the method according to the present invention for maintaining almost constant sputtering characteristic at target as well as deposition rate when the sputtering target was operated by using HIPIMS techniques.

Experimental example of the application of a method according to the invention:

In order to be able to compare the results obtained within this experimental example with those displayed in the FIGS. 1 and 2, same coating configuration and conditions excepting the reactive gas partial pressure were used. The target used for performing this experimental example was also a disk-shaped aluminum-chromium-containing target (AlCr-target) manufactured by using powder metallurgical techniques, having a constant diameter of Ø150 mm and variable target thickness depending on the target age. Likewise, the element composition in atomic percentage of the used targets was 60 at.-% Al and 40 at-% Cr. For performing the coating processes a vacuum sputtering apparatus comprising a coating chamber with possibility of reactive HIPIMS film deposition, manufactured by the company Oerlikon Balzers, was used. Several sputtering deposition runs (coating runs) were carried out. In the same way as described before, for this experimental example a magnetic field was generated by using permanent magnets arranged behind the target in order to increase the probability of detention of electrons in the area in front of the target during coating process. No changes in the arrangement of the permanent magnets were made from process to process, but of course, by effect of the changes in the target thickness which is getting thinner during each coating run, the target surface is getting closer to the permanent magnets and consequently the magnetic field strength on the target surface changes depending on the target thickness. Nitrogen was used as reactive gas. The AlCr-targets were sputtered in the interior of the coating chamber by using HIPIMS techniques in a reactive argon-nitrogen atmosphere. Before starting each coating run cleaned uncoated flat substrate samples amongst others high speed steel and cemented carbide samples) were arranged in a rotating sample holder, which was in turn arranged in the interior of the coating chamber. AlCrN-films were respectively deposited onto the corresponding surface of the samples to be coated during, each coating run. The sputtering power density at the target (cathode) was kept constant at a main value of about 1.0 kW/cm$^2$ for all coating runs. Also the substrate temperature was maintained constant at a value of about 450° C. for all coating runs. Target weight was measured before and after each coating run. The used AlCr-target had a weight in new condition (before performing the first coating run) of about 830 g. The reduction of the target weight after each coating run was confirmed as expected. The targets were used until a weight of about 570 g was attained. The lowest target weight for accomplishing a coating run was essentially defined by the lowest target thickness at which the mechanical stability of the target is not jeopardized. During each coating run the target characteristic was monitored by measuring voltage and current density at target. At the beginning of each coating run the nitrogen partial pressure was adjusted as quick as possible (in less than 5 minutes) in order to maintain the sputtering characteristic at the target as constant as possible. It means particularly in the context of the present invention that the reactive partial pressure was adjusted in order to maintain the voltage and current density values at target in an acceptable variation range. After that, the nitrogen partial pressure was maintained constant until complete the total effective coating time for forming a film onto the surface of the samples to be coated during each coating run. The total effective coating time for each coating run was 117 minutes. The thickness of the deposited AlCrN-films was measured after each coating run. The overall variation range of the nitrogen partial pressure within this experimental example, which was determined taking into account each nitrogen partial value adjusted at the beginning of each coating run was from 0.27 Pa to 0.19 Pa.

Figure 3:
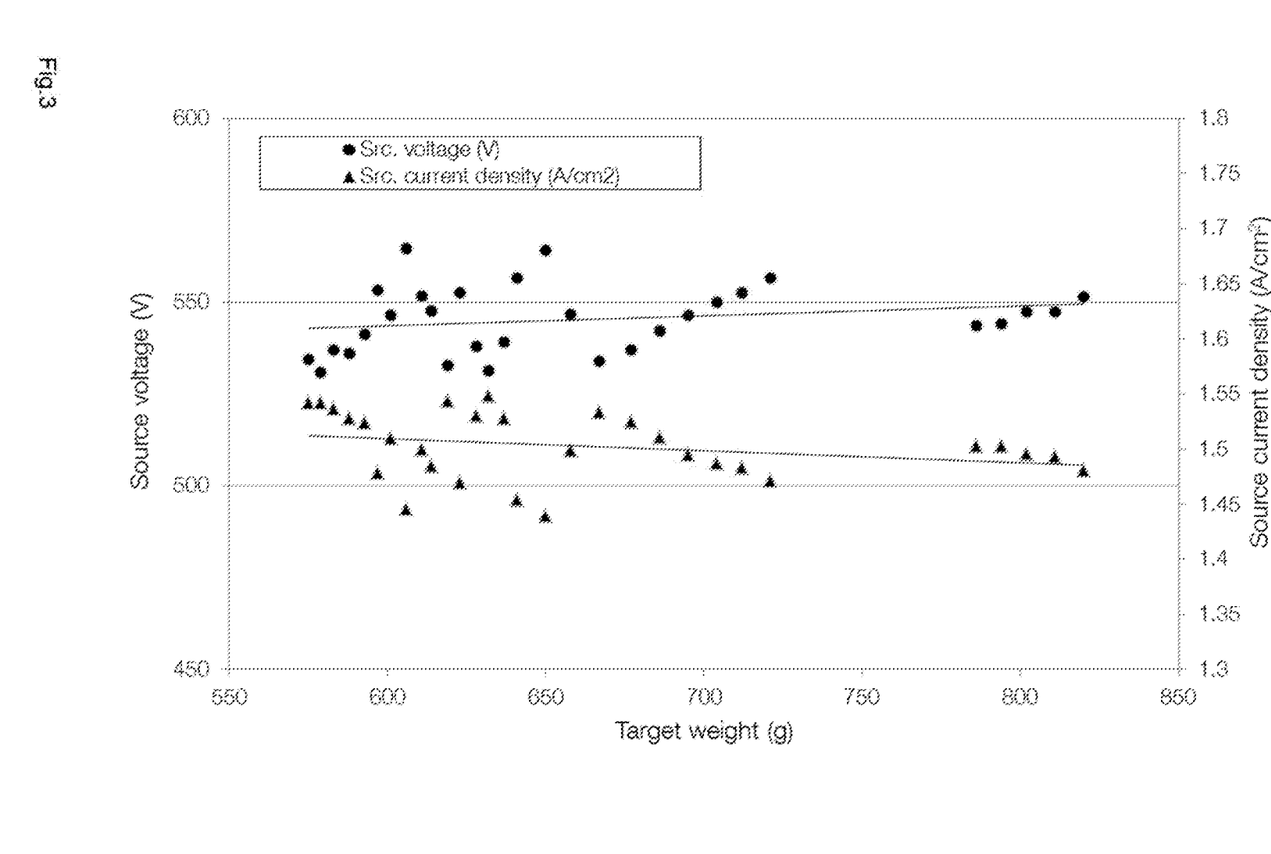
FIG. 3 shows the variation of the source (target) voltage in volts and current density in amperes per square centimeter in relation to the target weight in grams obtained by reactive sputtering with the nitrogen partial pressure adjusted in order to maintain the sputtering characteristic at the target as constant as possible.
Figure 4:
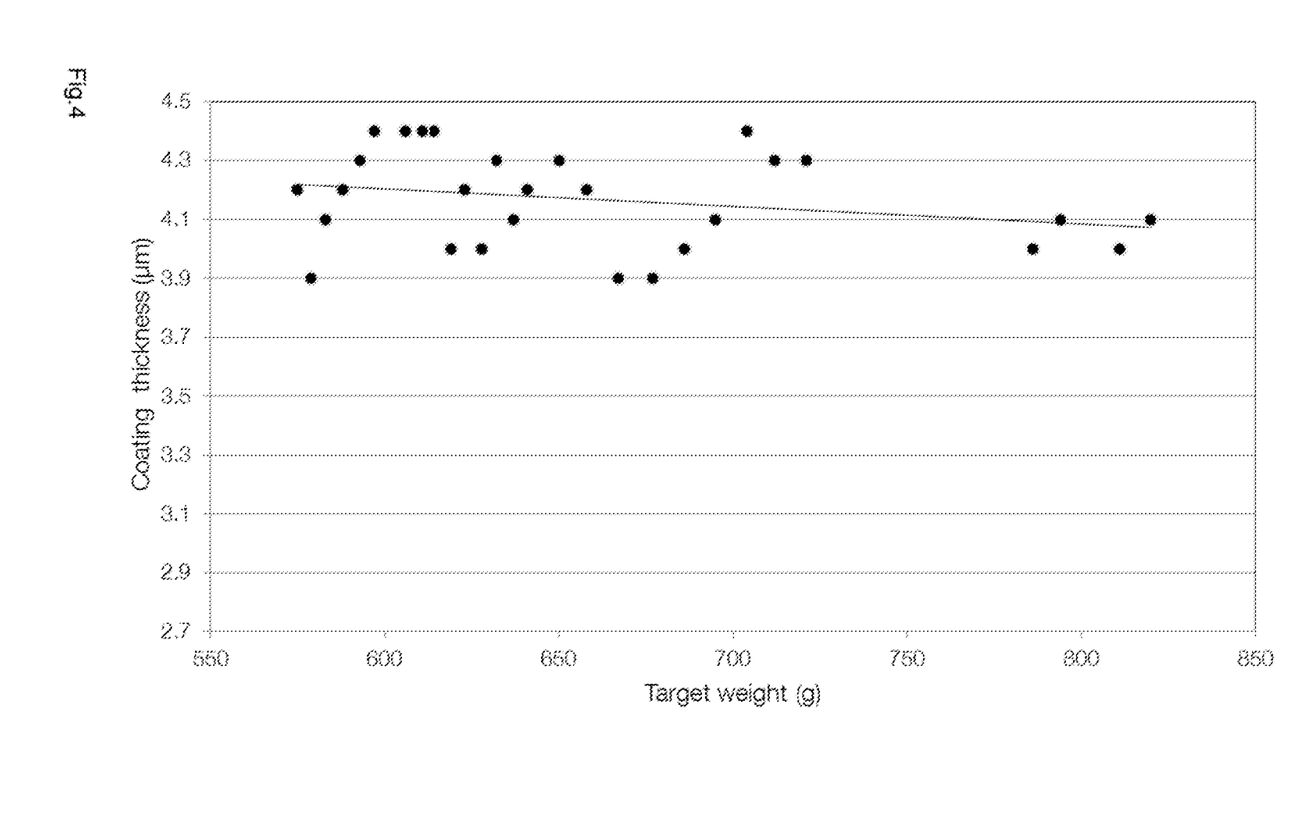
FIG. 4 shows the measured coating thickness in µm of the films deposited on the surface of flat samples in relation to the weight in grams of the target used for the film deposition with the nitrogen partial pressure adjusted in order to maintain the sputtering characteristic at the target as constant as possible.

The average values of voltage and current density at the target measured during each coating run as well as the film thickness measured after each coating run in relation to the average weight that the target had during each run are shown in the FIGS. 3 and 4, respectively.

Thus, it is demonstrated that by using the method according to the present invention it is possible to maintain the sputtering characteristic, at target as well as the film deposition rate almost constant or in an acceptable variation range for the industrial production context independent of the target age.

The present invention provides a method for performing a coating process involving sputtering techniques in which at least one target is sputtered in an atmosphere comprising at least one reactive gas and sputtering characteristic values and/or coating rate are maintained within predefined target values as constant as possible, the method comprising following step:

maintaining a deviation of the sputtering characteristic and/or of the coating rate values from the target values within an acceptable deviation range for the industrial production context by adjusting the reactive gas partial pressure $p_{reactive\_gas}$ depending on the target weight $w_{target}$.

In one embodiment of a method according to the present invention the target is operated as cathode by supplying power in such a manner that the power density at the target is maintained constant during sputtering of the target.

In a further embodiment of a method according to the present invention the reactive gas partial pressure $p_{reactive\_gas}$ is adjusted depending, on the target weight $w_{target}$ according to a correlation $p_{reactive\_gas}$ vs. $w_{target}$ previously determined under corresponding coating conditions.

The correlation $p_{reactive\_gas}$ vs. $w_{target}$ is determined before performing the coating process preferably by using a method comprising, at least the following steps:

a) Providing a coating apparatus and further necessary elements as well as at least one target, preferably an in-new-condition target, of the same type required for accomplishing coating processes under same coating conditions like the above mentioned sputtering coating process having the deviation of the sputtering characteristic and/or of the coating rate values from the target values within an acceptable deviation range for the industrial production context.

b) Measuring the target weight before accomplishing a coating process i for obtaining $W_{target\_i\_initial}$.

c) Accomplishing the coating process i for depositing a film $f_i$ by maintaining all coating parameters in compliance with the coating, process referred before, excepting the reactive gas partial pressure, which is varied at the beginning of the coating process i until adjusting a reactive gas partial pressure value at which the predefined target values regarding sputtering characteristic, and maintaining afterwards the reactive gas partial pressure value $p_{reactive\_gas\_i}$ constant until a coating time $t_i$ is completed.

d) Measuring the target weight after accomplishing the coating process i for obtaining $w_{target\_i\_final}$, preferably measuring also the thickness of the film fi deposited during the coating process i.

e) Repeating the steps b, c and d for i=1, 2, . . . , n, where n>2.

f) Finding the correlation $p_{reactive\_gas}$ vs. $w_{target}$ by using the measured values of $p_{reactive\_gas\_i}$ and $W_{target\_i\_initial}$ or $p_{reactive\_gas\_i}$ and $(W_{target\_i\_initial}+W_{target\_i\_final})/2$.

Preferably, the number i=n corresponding to the total quantity of coating processes to be accomplished for determining the correlation $p_{reactive\_gas}$ vs. $w_{target}$ is chosen taking the target thickness into account, preferably the highest n is limited by attaining the lowest target thickness at which the mechanical stability of the target is still not jeopardized.

Preferably, the coating time $t_i$ is chosen as long as possible in order to deposit a film $f_i$ having a thickness which is thick enough for making a reliable evaluation of the average deposition rate during the coating process i, preferably ti is the same for every coating process i.

Preferably, the coating time $t_i$ for each coating process i is chosen in such a way that the deviation of the sputtering characteristic and/or of the coating rate values from the target values is maintained within an acceptable deviation range for the industrial production context during each coating process I, preferably ti is the same for every coating process i.

According to another embodiment of a method according to the present invention the initial target weight $w_{target\_initial}$ is measured before starting the coating process and the reactive gas partial pressure $p_{reactive\_gas}$ is adjusted ab initio of the coating process and maintained constant during the coating process.

According to one more embodiment of a method according to the present invention the target weight $w_{target}$ is measured ab initio and/or during the coating process and the reactive gas partial pressure $p_{reactive\_gas}$ is adjusted ab initio and/or during the coating process.

Preferably, the reactive gas partial pressure $p_{reactive\_gas}$ is adjusted automatically.

Preferably, the at least one target comprises at least one element from Ti, Al, Si, Zr, Hf, V. Nb, Ta, Mn, Fe, Co, Ni. Pd, Pt, Cu, Ag, Au, Zn, Cd.

Preferably, the at least one reactive gas is nitrogen or oxygen or a carbon-containing gas or a mixture containing at least two thereof.

Preferably, the coating atmosphere comprises at least one inert gas, which is preferably argon or neon or krypton or a mixture containing at least two thereof.

Preferably, the sputtering techniques involve magnetron sputtering techniques and/or magnetron sputtering ion plating techniques and/or HIPIMS techniques.

The present invention discloses also a substrate coated with a coating comprising at least one film produced by a coating process performed according to a method according to the present invention.

Preferably, the coated substrate is a tool, particularly a cutting or a forming tool.

Similarly, the coated substrate can be a component, particularly an engine component, or a turbine component, or an automobile component, or a decorative component, or a medical instrument, etc.

Furthermore, the present invention discloses an apparatus for accomplishing a coating process according to a method according to the present invention.

Preferably, the apparatus comprises a device for measuring target weight automatically.

Preferably, the apparatus comprises a device for adjusting the reactive gas partial pressure automatically.

A method according to the present invention can be used in general for performing a coating process by using sputtering techniques in which sputtering characteristic values and coating rate are maintained within predefined target values as constant as possible, the coating process being performed in a coating chamber of a sputtering apparatus, the process involving the use of at least one target comprising at least one metal element, the target being operated as a cathode by supplying power to the target from a power supply in such a manner that the power density at the target is maintained constant during sputtering of the target in an atmosphere containing at least one reactive gas and at least one inert gas, the inert gas being at least partially ionized, so that the target surface is sputtered at least by effect of collision of the inert gas electrically positive charged ions with the target, the target having an initial target weight $w_{target\_initial}$ before starting sputtering, the sputtering of the target surface resulting in a reduction of the target weight from the initial target weight $w_{target\_initial}$ to a reduced target weight $w_{target\_reduced} < w_{target\_initial}$, which in turn causes a deviation of the sputtering characteristic and/or of the coating rate values from the target values, the method comprising the step consisting of:

maintaining the deviation of the sputtering characteristic and/or of the coating rate values from the target values within an acceptable deviation range for the industrial production context independent of the target weight by adjusting the reactive gas partial pressure $p_{reactive\_gas}$ depending on the target weight $w_{target}$, preferably according to a correlation $p_{reactive\_gas}$ vs. $w_{target}$ previously determined under corresponding coating conditions.

The invention claimed is:

1. A method for performing a coating process involving sputtering techniques, comprising:
   sputtering at least one target in an atmosphere comprising at least one reactive gas and maintaining sputtering characteristic values and/or coating rate within predefined target values as constant as possible, wherein a deviation of the sputtering characteristic values and/or of the coating rate values from the target values is maintained within an acceptable deviation range for an industrial production context by adjusting a reactive gas partial pressure $p_{reactive\_gas}$ depending on a target weight $w_{target}$.

2. The method according to claim 1, comprising operating the target as a cathode by supplying power in such a manner that a power density at the target is maintained constant during sputtering of the target.

3. The method according to claim 1, comprising adjusting the reactive gas partial pressure $p_{reactive\_gas}$ depending on the target weight $w_{target}$ according to a correlation $p_{reactive\_gas}$ vs. $w_{target}$ previously determined under corresponding coating conditions.

4. The method according to claim 3, comprising determining the correlation $p_{reactive\_gas}$ vs. $w_{target}$ before performing the coating process by using a method comprising at least following steps:
   a) Providing a coating apparatus and further necessary elements as well as at least one in-new-condition target, of the same type required for accomplishing a coating process in compliance with the coating process referred to in claim 3;
   b) Measuring the target weight before accomplishing a coating process i for obtaining $W_{target\_i\_initial}$;
   c) Accomplishing the coating process i for depositing a film $f_i$ by maintaining all coating parameters in compliance with the coating process referred to in claim 3, except for the reactive gas partial pressure, which is varied at the beginning of the coating process i until adjusting a reactive gas partial pressure value $p_{reactive\_gas\_i}$ at which the predefined target values regarding sputtering characteristic, and maintaining afterwards the reactive gas partial pressure value $p_{reactive\_gas\_i}$ constant until a coating time $t_i$ is completed;
   d) Measuring the target weight after accomplishing the coating process i for obtaining $W_{target\_i\_final}$, and measuring also a thickness of the film fi deposited during the coating process i;
   e) Repeating steps b, c and d for i=1, 2, . . . , n, where n>2; and
   f) Finding the correlation $p_{reactive\_gas}$ vs. $w_{target}$ by using the measured values of $p_{reactive\_gas\_i}$ and $W_{target\_i\_initial}$ or $p_{reactive\_gas\_i}$ and $(W_{target\_i\_initial} + W_{target\_i\_final})/2$.

5. The method according to claim 4, comprising choosing the number i=n corresponding to a total quantity of coating processes to be accomplished for determining the correlation $p_{reactive\_gas}$ vs. $w_{target}$ by taking the target thickness into account, wherein a highest n is limited by attaining a lowest target thickness at which mechanical stability of the target is still not jeopardized.

6. The method according to claim 4, comprising choosing the coating time $t_i$ as long as possible in order to deposit a film $f_i$ having a thickness which is thick enough for making a reliable evaluation of an average deposition rate during the coating process i, wherein ti is the same for every coating process i.

7. The method according to claim 4, comprising choosing the coating time $t_i$ for each coating process i in such a way that a deviation of the sputtering characteristic and/or of the coating rate values from the target values is maintained within an acceptable deviation range for the industrial production context during each coating process i, wherein ti is the same for every coating process i.

8. The method according to claim 4, comprising measuring the initial target weight $w_{target\_initial}$ before starting the coating process and adjusting the reactive gas partial pressure $p_{reactive\_gas}$ ab initio of the coating process and maintaining the reactive gas partial pressure $p_{reactive\_gas}$ constant during the coating process.

9. The method according to claim 1, comprising measuring the target weight $w_{target}$ ab initio and/or during the coating process and adjusting the reactive gas partial pressure $p_{reactive\_gas}$ ab initio and/or during the coating process.

10. The method according to claim 1, comprising adjusting the reactive gas partial pressure $p_{reactive\_gas}$ automatically.

11. The method according to claim 1, wherein the at least one target comprises at least one element selected from the group consisting of Ti, Al, Si, Zr, Hf, V, Nb, Ta, Mn, Fe, Co, Ni, Pd, Pt, Cu, Ag, Au, Zn, and Cd.

12. The method according to claim 1, wherein the at least one reactive gas is nitrogen or oxygen or a carbon-containing gas or a mixture containing at least two thereof.

13. The method according to claim 1, wherein the atmosphere comprises at least one inert gas selected from the group consisting of argon, neon, krypton, and a mixture containing at least two thereof.

14. The method according to claim 1, wherein the sputtering techniques comprise at least one of the group consisting of magnetron sputtering techniques, magnetron sputtering ion plating techniques, and HIPIMS techniques.

15. A substrate coated with a coating comprising at least one film produced by a coating process performed according to the method according to claim 1.

16. An apparatus for accomplishing a coating process according to the method according to claim 1, wherein the apparatus comprises a device for measuring target weight $W_{target}$ automatically.

17. An apparatus for accomplishing a coating process according to the method according to claim 1, wherein the apparatus comprises a device for adjusting the reactive gas partial pressure automatically.

* * * * *